(12) United States Patent
Lee et al.

(10) Patent No.: US 8,486,801 B2
(45) Date of Patent: Jul. 16, 2013

(54) FABRICATING METHOD OF DRAM STRUCTURE

(75) Inventors: Tzung-Han Lee, Taipei (TW); Chung-Lin Huang, Taoyuan County (TW); Ron Fu Chu, Taipei (TW)

(73) Assignee: Inotera Memories, Inc., Taoyuan (TW)

( * ) Notice: Subject to any disclaimer, the term of this patent is extended or adjusted under 35 U.S.C. 154(b) by 134 days.

(21) Appl. No.: 13/297,276

(22) Filed: Nov. 16, 2011

(65) Prior Publication Data

US 2013/0052786 A1 Feb. 28, 2013

(30) Foreign Application Priority Data

Aug. 22, 2011 (TW) ............................... 00130023 A

(51) Int. Cl.
*H01L 21/00* (2006.01)
*H01L 27/108* (2006.01)
*H01L 29/94* (2006.01)

(52) U.S. Cl.
USPC ........... 438/393; 438/395; 438/397; 257/306; 257/E21.008

(58) Field of Classification Search
USPC ........... 438/393, 395, 397; 257/306, E21.008
See application file for complete search history.

(56) References Cited

U.S. PATENT DOCUMENTS

| 6,255,151 | B1 * | 7/2001 | Fukuda et al. ............... 438/197 |
| 6,406,971 | B1 | 6/2002 | Chien |
| 7,851,356 | B2 | 12/2010 | Tegen |

* cited by examiner

*Primary Examiner* — Olik Chaudhuri
*Assistant Examiner* — Wilner Jean Baptiste
(74) *Attorney, Agent, or Firm* — Winston Hsu; Scott Margo

(57) ABSTRACT

A fabricating method of a DRAM structure includes providing a substrate comprising a memory array region and a peripheral region. A buried gate transistor is disposed within the memory array region, and a planar gate transistor is disposed within the peripheral region. Furthermore, an interlayer dielectric layer covers the memory array region, the buried gate transistor and the planar gate transistor. Then, a capping layer of the planar gate transistor and part of the interlayer dielectric layer are removed simultaneously so that a first contact hole, a second contact hole and a third contact hole are formed in the interlayer dielectric layer. A drain doping region of the buried gate transistor is exposed through the first contact hole, a doping region of the planar gate transistor is exposed through the second contact hole, and a gate electrode of the planar gate transistor is exposed through the third contact hole.

5 Claims, 6 Drawing Sheets

FABRICATING METHOD OF DRAM STRUCTURE

BACKGROUND OF THE INVENTION

1. Field of the Invention

The present invention relates to a fabricating method of a dynamic random access memory (DRAM) structure. In particular, the present invention is directed to a fabricating method of a DRAM structure integrated with a memory array region and a peripheral region.

2. Description of the Prior Art

Dynamic random access memory (DRAM) is a critical element in many electronic products. There are a lot of memory cells in the DRAM to collectively form an array region to store data. Each memory cell is formed of a metal oxide semiconductor (MOS) and a capacitor electrically connected in series.

The capacitor is a data storage accessible to the drain of the MOS and electrically connected to the conductors in the storage node and the node contact to store data or to output data.

In order to decrease the time for fabrication and to simplify the fabrication process, the periphery circuits are fabricated collaterally. Further, in accordance with different demands of the elements, transistors of different functions are respectively formed in the memory array region and in the periphery circuit region. After the completion of the transistors, the interconnections are formed in accordance with different demands. However, with the trends of shrinking dimensions of the elements, a novel DRAM process is needed to increase the productivity and yield of DRAM.

SUMMARY OF THE INVENTION

The present invention provides a novel DRAM fabrication process to integrate the memory array region and in the periphery circuit region so as to simplify the fabrication process.

In accordance with one embodiment of the present invention, the present invention proposes a fabricating method of a dynamic random access memory (DRAM) structure. The DRAM structure is formed on a substrate. The substrate includes a memory array region and a peripheral region, at least one buried gate transistor which is disposed within the memory array region, at least one planar gate transistor which is disposed within the peripheral region, an interlayer dielectric layer which covers the memory array region, the peripheral region, the buried gate transistor and the planar gate transistor. The planar gate transistor includes a planar gate electrode disposed on the substrate, a capping layer covering the planar gate electrode, a first source doping region and a first drain doping region respectively disposed within the substrate adjacent to two sides of the planar gate electrode. The buried transistor includes a buried gate electrode disposed in the substrate, a second source doping region and a second drain doping region respectively disposed within the substrate adjacent to two sides of the buried gate electrode. The fabricating method of the DRAM structure is as follows. First, part of the interlayer dielectric layer and the capping layer of the planar transistor are removed to form a first contact hole, a second contact hole and a third contact hole in the interlayer dielectric layer. The second drain doping region is exposed through the first contact hole, one of the first source doping region and the first drain doping region is exposed through the second contact hole, and the planar gate transistor is exposed through the third contact hole. Then, a conductive layer is formed to fill up the first contact hole, the second contact hole and the third contact hole and to cover the interlayer dielectric layer. Later, the conductive layer on the interlayer dielectric layer is patterned to form a first conductive pad, a second conductive pad and a third conductive pad on the interlayer dielectric layer to be respectively electrically connected to the conductive layer disposed within the first contact hole, within the second contact hole and within the third contact hole.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
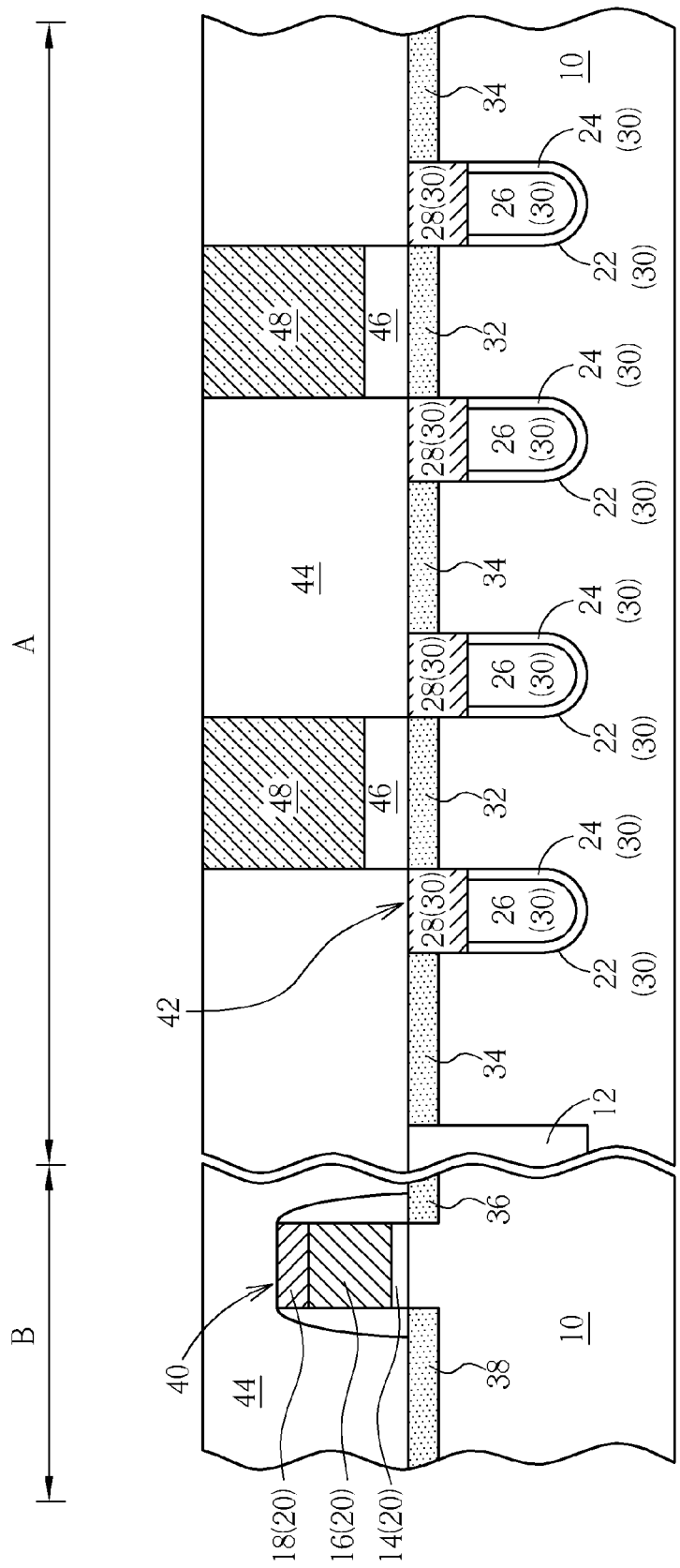
FIGS. 1 to 6 illustrate a fabricating method of a dynamic random access memory (DRAM) structure of the present invention in accordance with one preferred embodiment of the present invention.

In the following description, numerous specific details are given to provide a thorough understanding of the invention. However, it will be apparent to one skilled in the art that the invention may be practiced without these specific details. In order to avoid obscuring the present invention, some well-known system configurations and process steps are not disclosed in detail.

Likewise, the drawings showing embodiments of the apparatus are semi-diagrammatic and not to scale and, particularly, some of the dimensions are for the clarity of presentation and are shown exaggerated in the figures. Also, in which multiple embodiments are disclosed and described having some features in common, for clarity and ease of illustration and description thereof, like or similar features will ordinarily be described with like reference numerals. In addition, in embodiments the source and the drain can be exchanged.

FIGS. 1 to 6 illustrate a fabricating method of a dynamic random access memory (DRAM) structure of the present invention in accordance with one preferred embodiment of the present invention. As shown in FIG. 1, a substrate 10 is provided. The substrate 10 includes a memory array region A and a peripheral region B. In addition, there is a shallow trench isolation 12 disposed in the substrate 10 within the memory array region A. The shallow trench isolation 12 may be formed by firstly forming a shallow trench (not shown) in the substrate 10 then by filling the shallow trench (not shown) with an insulation material such as silicon oxide.

Then a dielectric layer 14, a conductive layer 16 and a dielectric layer 18 are entirely formed on the substrate 10. The conductive layer 16 may be poly-Si, metal or other conductive material. The dielectric layer 14 may be silicon oxide and the dielectric layer 18 may be silicon nitride. Next, the dielectric layer 14, the conductive layer 16 and the dielectric layer 18 are etched to form at least one planar gate 20 in the peripheral region B and the remaining dielectric layer 14, the conductive layer 16 and the dielectric layer 18 in the memory array region A are removed. The above mentioned dielectric layer 14 and conductive layer 16 serve as the gate dielectric layer 14 and the gate electrode 16 of the planar gate 20 respectively. The dielectric layer 18 serve as a cap layer 18 of the planar gate 20.

Later, at least one gate trench 22 is formed in the substrate 10 of the memory array region A, followed by forming a gate dielectric layer 24 on the inner sidewall of the gate trench 22, then a gate electrode 26 is formed in the gate trench 22 and further to form a cap layer 28 to cover the gate electrode 26. Right now, the buried gate transistor 30 is finished. The steps to form the gate electrode 26 maybe as follows. First, a conductive layer (not shown) is formed in the gate trench 22 of the memory array region A and on the substrate 10. Next, an etching-back is carried out on the conductive layer (not shown) to remove part of the conductive layer (not shown) disposed in the gate trench 22 so the remaining conductive layer (not shown) may serve as the gate electrode 26. The gate electrode 26 may be a metal, a poly-Si or other conductive materials.

Next, a source doping region 32/36 and a drain doping region 34/38 are respectively formed in the substrate 10 disposed at two sides of the planar gate 20 and the buried gate transistor 30. At this moment, the planar gate 20, the source doping region 36 and the drain doping region 38 together form a planar gate transistor 40, and the buried gate 30, the source doping region 32 and the drain doping region 34 together form a buried gate transistor 42.

Further, an interlayer dielectric layer 44 is formed to cover the substrate 10, the planar gate transistor 40 and the buried gate transistor 42. The interlayer dielectric layer 44 usually has silicon oxide. A bit plug 46 and a bit line 48 are electrically connected to the bit plug 46 in the interlayer dielectric layer 44. The bit plug 46 contacts the source doping region 32.

Figure 2:
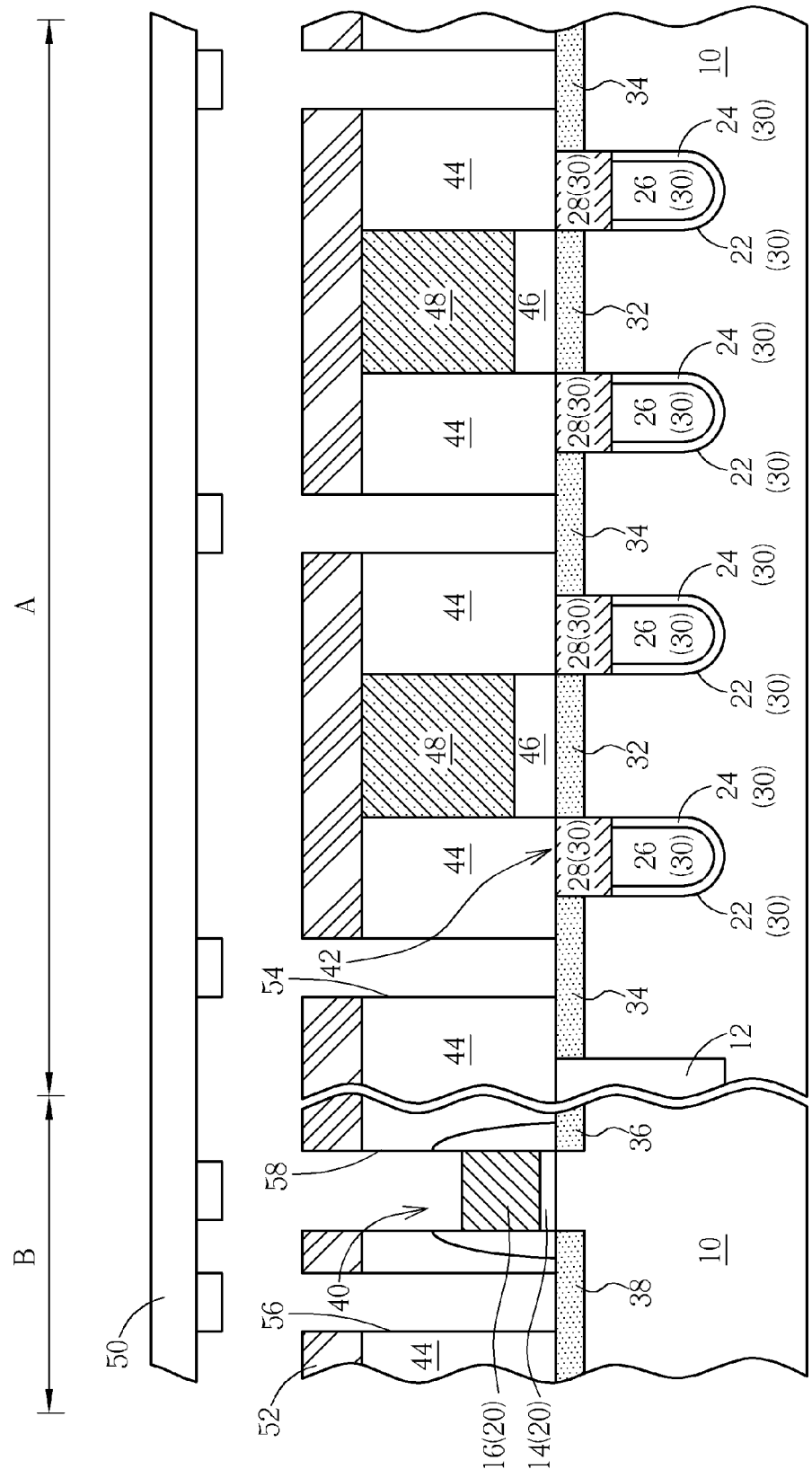
Figure 3:
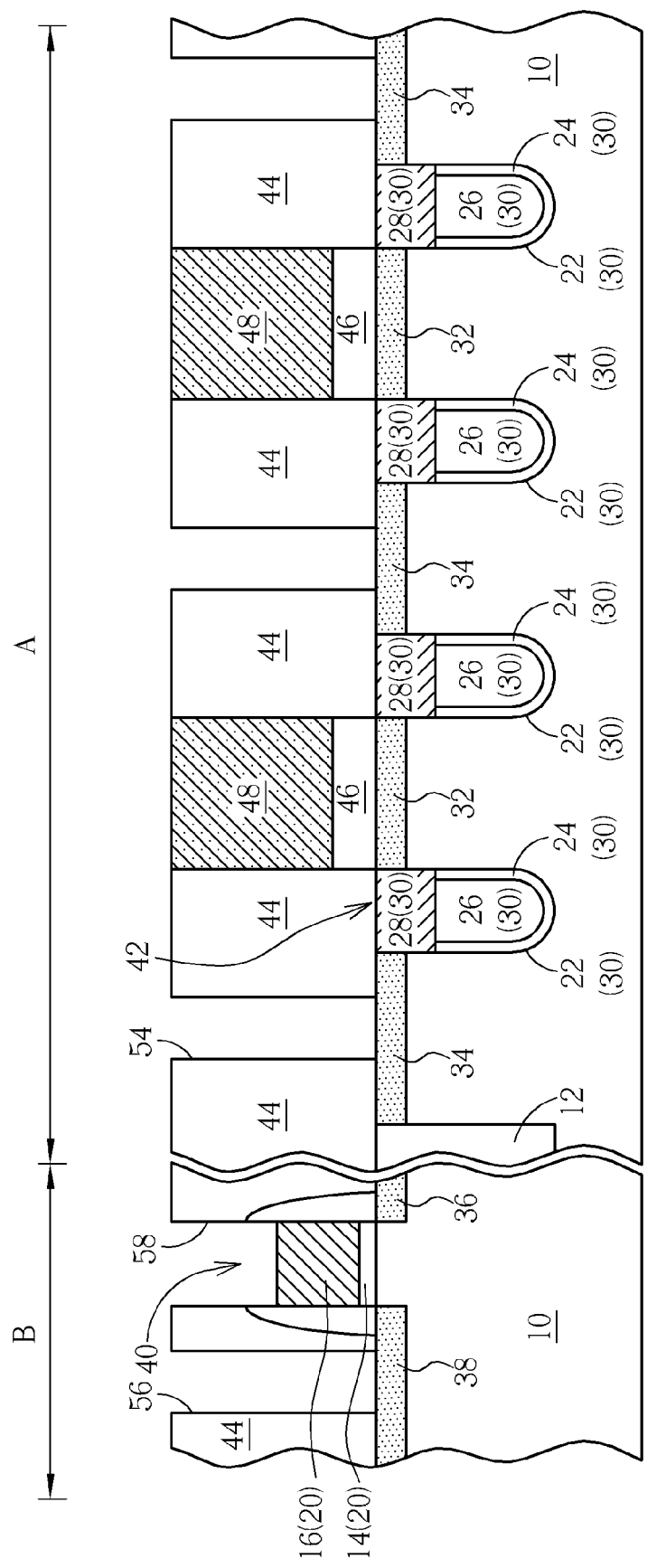

As shown in FIG. 2, a photomask 50 along with an exposure and lithographic procedure are used to pattern the interlayer dielectric layer 44 and to remove the cap layer 18 of the planar gate 20. In detail, first a photoresist 52 is formed entirely on the interlayer dielectric layer 44. Then the photomask 50 is used to pattern the photoresist 52. When the photoresist 52 is patterned and developed, the photoresist 52 is used as an etching mask to etch the interlayer dielectric layer 44 and the cap layer 18 of the planar gate 20, to form a first contact hole 54 in the memory array region A, a second contact hole 56 in the peripheral region and a third contact hole 58. The drain doping region 36 or the drain doping region 38 of the planar gate transistor 40 is exposed through the second contact hole 56. FIG. 2 illustrates the exposure of the drain doping region 38. The planar gate electrode 16 is exposed through the third contact hole 58. Then as shown in FIG. 3, the photoresist 52 is removed.

Figure 4:
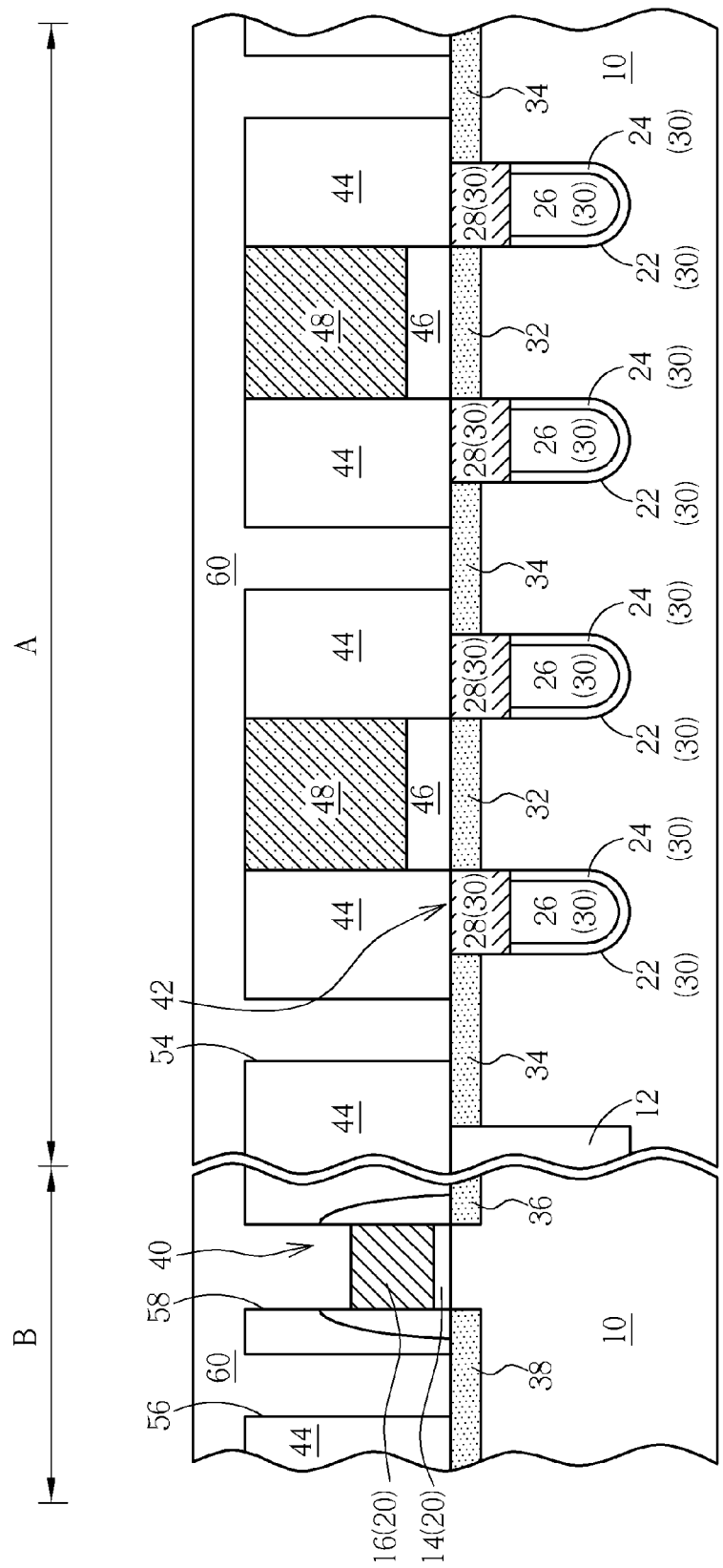
Figure 5:
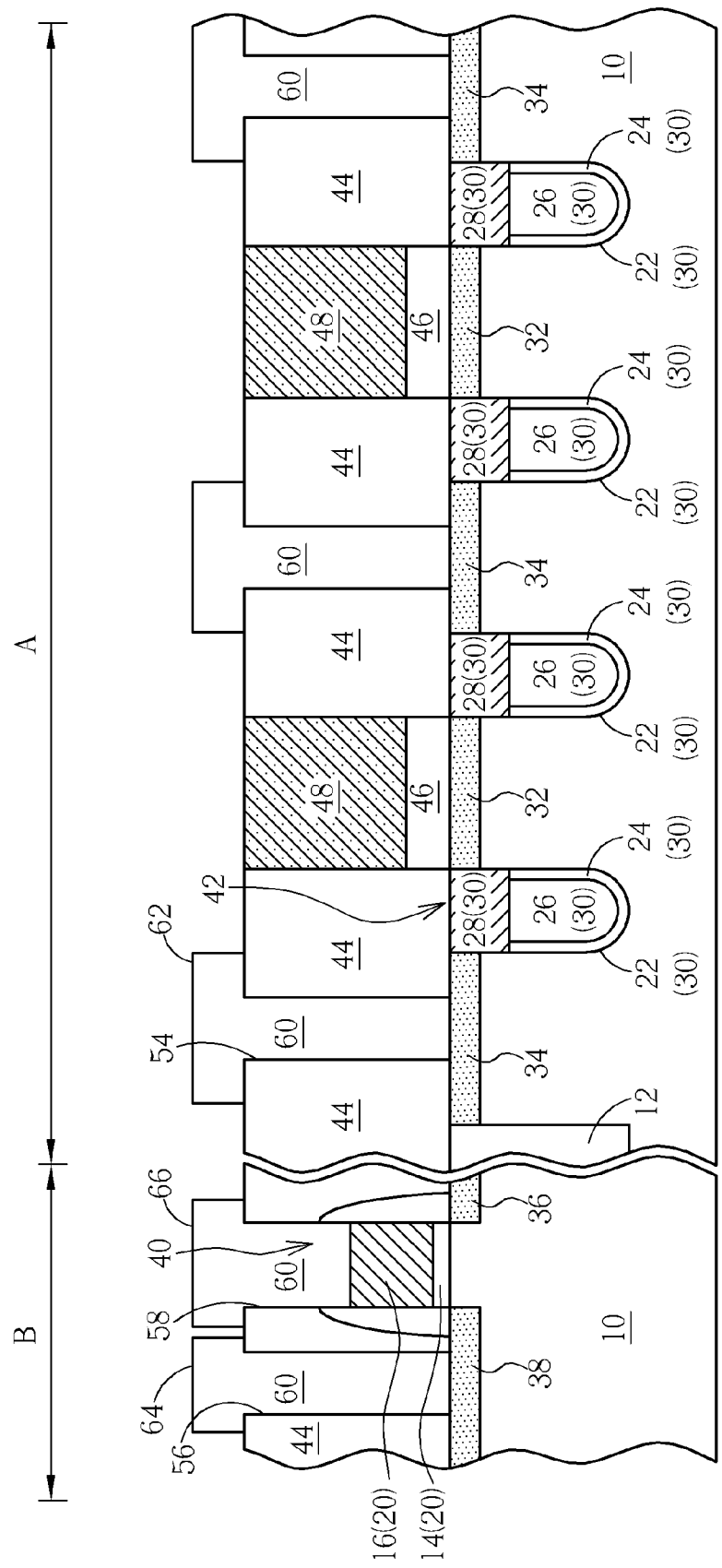

As shown in FIG. 4, a conductive layer 60, such as a metal layer, is formed to fill the first contact hole 54, the second contact hole 56 and the third contact hole 58. The conductive layer 60 covers the interlayer dielectric layer 44. As shown in FIG. 5, part of the conductive layer 60 on the interlayer dielectric layer 44 is removed to pattern the conductive layer 60. After the conductive layer 60 is patterned, the conductive layer 60 on the interlayer dielectric layer 44 becomes a first conductive pad 62, a second conductive pad 64 and a third conductive pad 66 respectively electrically connected to the conductive layer 60 disposed within the first contact hole 54, within the second contact hole 56 and within the third contact hole 58. The conductive layer 60 in the first contact hole 54 serves as a drain contact plug. Depending on the design of the circuits, the conductive layer 60 disposed in the second contact hole 56 may be electrically connected to the drain doping region 36 or the drain doping region 38 of the planar gate transistor 40. FIG. 4 illustrates the electric connection of the drain doping region 38. In addition, the conductive layer 60 in the third contact hole 58 may serve as a gate contact plug.

Figure 6:
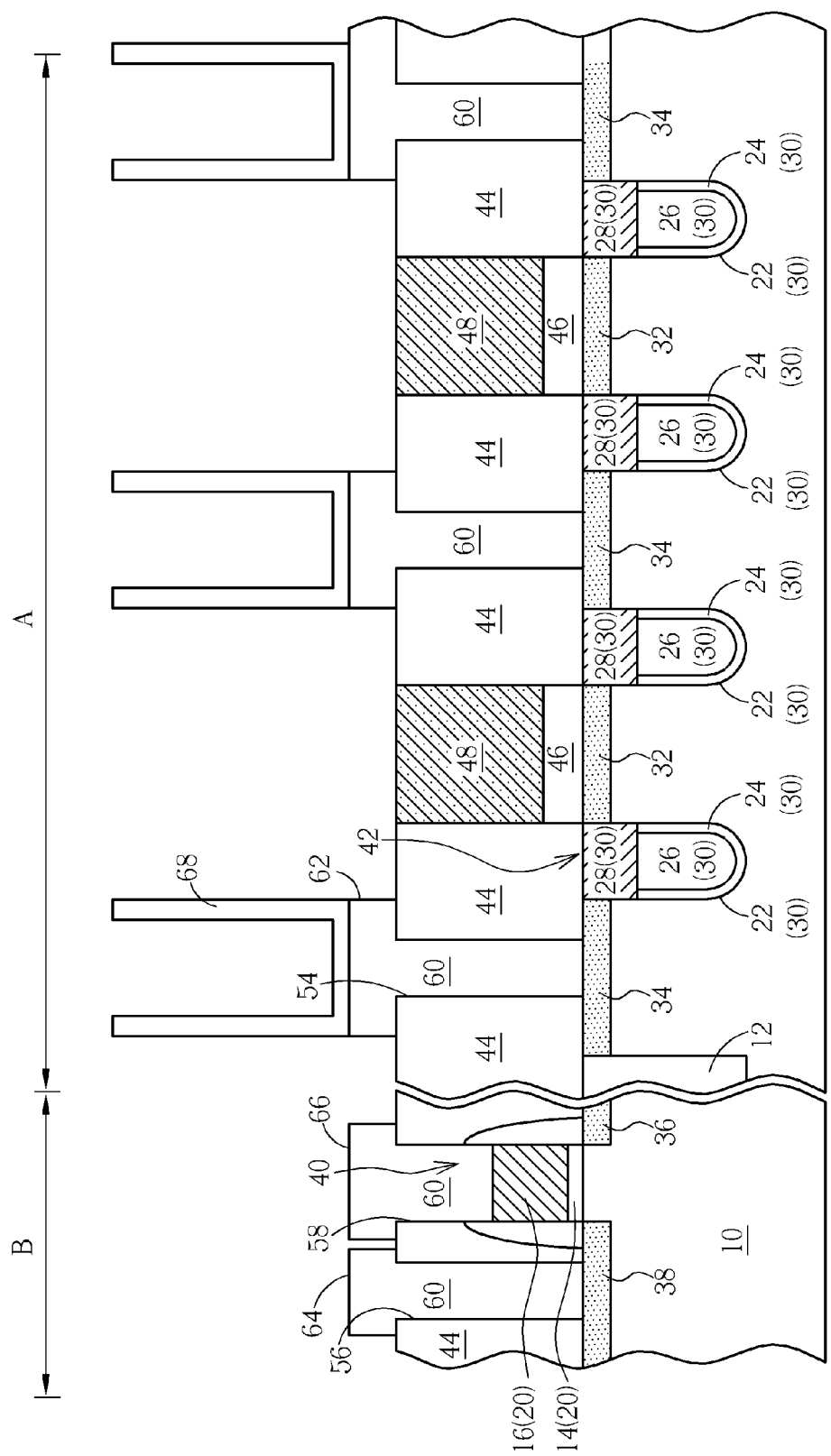

As shown in FIG. 6, at least one capacitor 68 is formed in the memory array region A to contact the first conductive pad 62 so the capacitor 68 is electrically connected to the drain doping region 34 by means of the first conductive pad 62 and the conductive layer 60 disposed in the third contact hole 58.

The fabricating method of the present invention which integrates a memory array region with a peripheral region forms the contact plugs in a same step in the memory array region and in the peripheral region and simultaneously forms the contact pads in a later step to simplify the fabrication process and to increase the production yield.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A fabricating method of a dynamic random access memory (DRAM) structure, said DRAM structure being formed on a substrate comprising a memory array region and a peripheral region, at least one buried gate transistor disposed within said memory array region, at least one planar gate transistor disposed within said peripheral region, an interlayer dielectric layer covering said memory array region, said peripheral region, said buried gate transistor and said planar gate transistor, wherein said planar gate transistor comprises a planar gate electrode disposed on said substrate, a capping layer covers said planar gate electrode, a first source doping region and a first drain doping region are respectively disposed in said substrate adjacent to two sides of said planar gate electrode, said buried transistor comprises a buried gate electrode disposed in said substrate, and a second source doping region and a second drain doping region are respectively disposed in said substrate adjacent to two sides of said buried gate electrode, said fabricating method of the DRAM structure comprising:

removing part of said interlayer dielectric layer and said capping layer of said planar gate transistor to form a first contact hole, a second contact hole and a third contact hole in said interlayer dielectric layer, wherein said second drain doping region is exposed through said first contact hole, one of said first source doping region and said first drain doping region is exposed through said second contact hole and said planar gate electrode is exposed through said third contact hole;

forming a conductive layer to fill up said first contact hole, said second contact hole and said third contact hole and to cover said interlayer dielectric layer; and patterning said conductive layer on said interlayer dielectric layer to form a first conductive pad, a second conductive pad and a third conductive pad on said interlayer dielectric layer so that said first conductive pad, said second conductive pad and said third conductive pad are respectively electrically connected to said conductive layer disposed within said first contact hole, within said second contact hole and within said third contact hole.

2. The fabricating method of the DRAM structure of claim 1, further comprising:

forming a capacitor contacting said first conductive pad and electrically connected to said second drain doping region of said buried gate transistor after forming said first conductive pad, said second conductive pad and said third conductive pad.

3. The fabricating method of the DRAM structure of claim 1, wherein a bit plug is disposed within said interlayer dielectric layer and contacting said second source doping region of said buried gate transistor.

4. The fabricating method of the DRAM structure of claim 1, wherein said interlayer dielectric layer comprises silicon oxide.

5. The fabricating method of the DRAM structure of claim 1, wherein said first contact hole, said second contact hole and said third contact hole are formed by means of a same reticle.

* * * * *

UNITED STATES PATENT AND TRADEMARK OFFICE
CERTIFICATE OF CORRECTION

PATENT NO. : 8,486,801 B2  
APPLICATION NO. : 13/297276  
DATED : July 16, 2013  
INVENTOR(S) : Tzung-Han Lee et al.

Page 1 of 1

It is certified that error appears in the above-identified patent and that said Letters Patent is hereby corrected as shown below:

On the title page, item (30), correct the application number of the Foreign Application Priority Data from "00130023" to --100130023--.

Signed and Sealed this
Eighth Day of October, 2013

Teresa Stanek Rea
*Deputy Director of the United States Patent and Trademark Office*